(12) United States Patent
Kan et al.

(10) Patent No.: US 6,184,305 B1
(45) Date of Patent: Feb. 6, 2001

(54) RADIATION ABSORBING POLYMER AND SYNTHESIS THEREOF

(75) Inventors: Wen-Bing Kan, Shizuoka; Akihiko Tokida, Kawagoe; Kayo Aramaki, Shizuoka; Hatsuyuki Tanaka, Shizuoka; Ken Kimura, Shizuoka, all of (JP)

(73) Assignee: Clariant Finance (BVI) Limited, Tortola (VG)

( * ) Notice: Under 35 U.S.C. 154(b), the term of this patent shall be extended for 0 days.

(21) Appl. No.: 09/079,565

(22) Filed: May 15, 1998

(30) Foreign Application Priority Data

Sep. 15, 1996 (JP) .................................................. 8-267907

(51) Int. Cl.⁷ .......................... C08F 20/08; C08F 120/08; C08F 26/08

(52) U.S. Cl. ..................................... 525/327.6; 525/327.4; 526/264

(58) Field of Search .............................. 525/327.4, 327.6; 526/264

(56) References Cited

U.S. PATENT DOCUMENTS

| | | | |
|---|---|---|---|
| 4,839,160 | * 6/1989 | Forestier et al. | 424/59 |
| 4,855,215 | 8/1989 | Nakano et al. | 430/283 |
| 4,908,413 | * 3/1990 | Goertz et al. | 525/304 |
| 4,910,122 | 3/1990 | Arnold et al. | 430/313 |
| 4,963,160 | * 10/1990 | Hung et al. | |
| 5,057,399 | 10/1991 | Flaim et al. | 430/313 |
| 5,147,968 | * 9/1992 | Epstein et al. | 528/210 |
| 5,294,680 | 3/1994 | Knors et al. | 525/327 |
| 5,525,457 | 6/1996 | Nemoto et al. | 430/325 |
| 5,654,376 | * 8/1997 | Knors et al. | 525/327.4 |
| 5,665,856 | * 9/1997 | Nihira et al. | 528/353 |
| 5,731,385 | * 3/1998 | Knors et al. | 525/327.6 |

FOREIGN PATENT DOCUMENTS

| | | |
|---|---|---|
| 2 267 095 | 11/1993 | (GB) . |
| WO 94/12912 | 6/1994 | (WO) . |

OTHER PUBLICATIONS

"Production of PHotopolyer" JP 5–320227 (A) 3.12.93, appln. No. 4–130258 filed 22.5.1992, Seiko Epson Corp., Masamitsu Uehara, abstract only.

"Photo–Curable Composition" JP63–314205 (A) 22.12.1988, appln. No. 62–150013 filed Jun. 16, 1987, UBE Ind. Ltd., Hirosi Yasuno, abstract only.

* cited by examiner

*Primary Examiner*—David W. Wu
*Assistant Examiner*—Tanya Zalukaeva
(74) *Attorney, Agent, or Firm*—Hesna J. Pfeiffer; Krishna Banerjee; Scott E. Hanf

(57) ABSTRACT

A radiation absorbing polymer is characterized by having a main chain copolymer containing recurring units of dicarboxylic acid or carboxylic anhydride group with an organic chromophore bonded to the carboxyl group through methylene or alkylene linkage group, where the organic chromophore is bonded to the carboxyl group by esterification reaction. Residual carboxyl groups of the radiation absorbing polymer can optionally be amidized and/or imidized with an aromatic compounds having a reactive amino group. When the photoresist is applied on the antireflective coating and is exposed by radiation such as deep ultraviolet radiation, a resist pattern with high resolving power is formed, which is not affected by standing wave upon manufacturing integrated circuit elements.

4 Claims, 1 Drawing Sheet

RADIATION ABSORBING POLYMER AND SYNTHESIS THEREOF

TECHNICAL FIELD

This invention relates to a radiation absorbing polymer which absorbs the predetermined wavelength radiation, comprised of a polymer having chemically bonded thereto an organic chromophore, a film forming composition containing the radiation absorbing polymer, an antireflective coating formed from the film forming composition and, more particularly, to an antireflective coating being useful upon manufacturing integrated circuit elements by photo-lithography and to a process for preparing a novel polymer containing a radiation-absorbing chromophore compound.

BACKGROUND ART

In the field of manufacturing integrated circuit elements, photo-lithographic process is essential. In order to attain a higher degree of integration in manufacturing the integrated circuit elements, patterning technology to form still finer patterns by the photo-lithographic process has been studied and, in recent years, such studies have lead to development of a technology enabling submicron-ordered fine patterning. In such photo-lithographic process, a photoresist is applied to a substrate, a latent image of a mask pattern is created in the photoresist using a reduction projection exposure apparatus, then the latent image is developed using a proper developer solution to obtain a patterned resist with the desired width and pattern. However, many substrates used in the field of manufacturing integrated circuit elements have such a high reflectivity that, upon exposure, exposing light passing through the photoresist layer is reflected on the surface of the substrate and is again incident into the photoresist layer, which causes problems that desired patterns are not obtained or that patterns with some defects are formed due to the exposure by the reflected light of photoresist areas which is not to be exposed originally or due to the existence of standing wave formed by interference between the reflected light and the incident light. Various techniques have been investigated to solve the problems. For example, there have been attempted a technique of addition of dye having absorption at the exposure wavelength into the resist to reduce the amount of light passing through the resist and consequently reduce the amount of reflected light, and a technique of forming an antireflective layer between the resist and a substrate in order to prevent light reflection from the substrate into resist by absorbing light having reached to the surface of the substrate upon exposure. As the latter type techniques, there are illustrated a technique of forming a coating of an inorganic compound having radiation absorbing properties such as titanium nitride according to CVD method or vacuum deposition method or the like; a technique of forming an antireflective coating on a substrate by applying an organic polymer solution containing a light-absorbing dye dispersed or dissolved therein to the surface of the substrate; and a technique of using, as an antireflective layer, a radiation absorbing polymer wherein a chromophore of dye is chemically bonded to a backbone polymer, or a polymer which itself has a radiation absorbing property. As to the technique of using a radiation absorbing polymer and the materials used for it, related descriptions are given in, for example, Japanese Laid-open Patent Publication Nos. H6-75378 and H6-118656, WO 9412912, U.S. Pat. Nos. 4,910,122 and 5,057,399, etc. Recently, organic materials, particularly those wherein a chromophore is chemically bonded to a polymer skeleton, are being regarded as most promising, and then research and partly application have been being examined.

A general resist patterning process using the above-described organic antireflective layer is conducted in the following manner. Firstly, a solution for forming the anti-reflective layer is applied to a substrate and baked to thereby make the antireflective layer insoluble in a solvent for photoresist. Secondly, a photoresist coating is formed on the antireflective coating and, after subjecting to processes of exposure, development, etc., there is obtained a resist pattern on the antireflective layer. Then, the antireflective coating of the resist-free areas where the originally applied resist layer has been removed by the development is removed by dry etching.

Many conventionally known radiation absorbing polymers wherein a dye is chemically bonded to a skeletal polymer have a low solubility in solvents used for resists, and hence solvents being different from those used for resists, such as cyclohexanone, are often employed as a solvent for the radiation absorbing polymer. However, in case that a solvent used for forming the antireflective coating is different from that for photoresist, there may arise problems that process steps for forming the antireflective coating in manufacturing integrated circuits increase in number, process equipments become more complicated and, in some cases, properties of the resist layer themselves are adversely affected. For example, when the antireflective coating and the photoresist layer are formed by using the same coating apparatus as is often conducted, the solvent for photoresist composition must fully be washed off from the coating apparatus before coating the antireflective coating composition. Otherwise, materials for forming the antireflective coating might be precipitated due to the influence of mixing of the antireflective coating composition and remaining photoresist solution upon coating the antireflective coating composition. The precipitate thus formed might close up pipes for waste liquor, or might scatter as fine powder and deposit on the resist surface coated or antireflective coating surface, resulting in deterioration of quality such as deformation of resist pattern. Further, since two different solvents are used, two pipe lines for feeding a solvent for washing backside and periphery of substrate might, in some cases, be required; one line for antireflective coating, and the other line for resist. For example, with an antireflective composition using a polymer described in the aforesaid Japanese Laid-open Patent Publication No. H6-75378 wherein an amino aromatic compound is chemically bonded to a polymer skeleton having acid anhydride groups, there involves a problem that, since the composition well dissolves in cyclohexanone and scarcely dissolves in a solvent for resist, there is a disadvantage that edge rinsing is hard to be conducted by using the same coating apparatus as is used for coating the resist. In addition, an antireflective coating composition containing a low molecular weight dye dispersed in a polymer has also been developed. Such composition, however, often causes unevenness in coating thickness when coated on a surface of a substrate with difference in level, thus these problems are being desired to be improved. As is described hereinbefore, there has been eagerly desired to provide a radiation absorbing polymer which has a strong radiation absorbing property for predetermined wavelength radiation and shows excellent photo-lithographic processability, which is soluble in the same solvent as that used for photoresist, and which can form a uniform coating in thickness on a substrate with complicated uneven surface; a film forming composition containing the radiation absorbing polymer; and an antireflective coating formed from the film forming composition and having good properties.

It is, therefore, an object of the present invention to provide a radiation absorbing polymer adapted for forming an antireflective coating which shows high solubility for a solvent for photoresist, good uniformity coating thickness on a uneven surface, high antireflectivity, good adhesion, good dry etch-ability and good heat resistance, which enables one to form a resist pattern with excellent resolution, and to provide a process for preparing the polymer.

Another object of the present invention is to provide an antireflective coating which shows high antireflectivity, good adhesion, good dry etch-ability and good heat resistance, which enables one to form a resist pattern with excellent resolution through improved manufacturing steps.

A further object of the present invention is to provide a film forming composition adapted for forming the antireflective coating which can form an uniform antireflective coating in thickness even on a surface of a substrate with difference in level.

DISCLOSURE OF INVENTION

According to the present invention, the radiation absorbing polymer having the above-described properties is comprised of a first radiation absorbing polymer which is obtained by the esterification reaction between a polymer containing as a main chain a recurring unit having dicarboxylic acid group or acid anhydride group and an organic chromophore compound containing a hydroxyl group isolated from a conjugation system and which has absorption at the predetermined wavelength, or is comprised of a second radiation absorbing polymer which is obtained by amidizing and/or imidizing the remaining carboxylic acid group and/or acid anhydride group bound to the main chain of the first radiation absorbing polymer with an amino group-having compound and which absorbs the predetermined wavelength radiation. By the term "organic chromophore group containing a hydroxyl group isolated from a conjugation system" is meant that the conjugation system of organic chromophore is not directly bonded to the hydroxyl group. In addition, the present invention further includes a film forming composition containing the above-described radiation absorbing polymer and an antireflective coating formed by using the film forming composition. Additionally, formation of the film containing these radiation absorbing polymers on, for example, a substrate is conducted by dissolving the polymer in a proper solvent and applying the solution on the substrate according to a generally known method. The film forming composition may contain, in addition to the above-described radiation absorbing polymers, a low molecular compound or compounds or other polymers than that of the present invention.

The present invention will now be described in more detail below which, however, are not construed to limit the scope of the present invention in any way.

The first radiation absorbing polymer of the present invention capable of absorbing the predetermined wavelength radiation, which is obtainable by the esterification reaction between a polymer containing as a main chain a recurring unit having dicarboxylic acid group or acid anhydride group and an organic chromophore compound containing a hydroxyl group isolated from a conjugation system, is preferably a polymer which contains at least both a recurring unit represented by the following general formula 1 and a recurring unit represented by the following general formula 2:

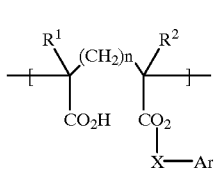

(1)

wherein
$R^1$ and $R^2$ represent independently a hydrogen atom, an alkyl group or other organic group, X represents a methylene group or a straight, branched or cyclic alkylene group containing at least two carbon atoms, Ar is an organic chromophore which absorbs the predetermined wavelength radiation and represents a substituted or non-substituted benzene ring, a heterocyclic ring or a condensed ring which is bonded to X directly or through an oxygen atom, a nitrogen atom or a sulfur atom if necessary, and n represents 0 or an integer of 1 or more:

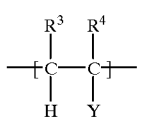

(2)

wherein
$R^3$ and $R^4$ represent independently a hydrogen atom an alkyl group, a carboxyl group or other organic group, and Y represents a hydrogen atom, a substituted or non-substituted alkoxy group, a substituted or non-substituted alkyl group, a substituted carbonyl group, a substituted or non-substituted oxycarbonyl group or a substituted or non-substituted phenyl group.

The above-described first radiation absorbing polymer can be obtained, for example, by esterifying a copolymer prepared by copolymerization of a monomer having a dicarboxylic acid group or an acid anhydride group and a monomer capable of forming the recurring unit of the above formula 2, with an organic chromophore compound represented by the following formula 4 and containing a hydroxyl group isolated from conjugation system:

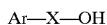

Ar—X—OH (4)

wherein X and Ar is the same as defined with respect to the above formula 1.

X in the above formula 1 or 4 is preferably exemplified by —CH$_2$—, —CH$_2$CH$_2$—, —CH$_2$CH$_2$CH$_2$— or —CH$_2$CH(CH$_3$)—.

Examples of the monomer to be used for forming the above-described recurring unit having a dicarboxylic acid group or an acid anhydride group include dicarboxylic acids or acid anhydrides such as maleic acid, maleic anhydride, and derivatives thereof, glutaric acid, glutaric anhydride and derivatives thereof, etc. Of these, acid anhydrides are preferred and maleic anhydride is particularly preferred.

The recurring unit of the above formula 2 can be obtained from monomers such as styrene, vinyl ether, acrylate, methacrylate or derivatives thereof, preferably styrene or alkyl vinyl ether, more preferably methyl vinyl ether. This recurring unit serves to improve solubility of the radiation absorbing polymer for solvents and provide a good film forming property when formed into an antirefletcive coating.

The first radiation absorbing polymer of the present invention preferably has a molecular weight of from about 300 to about a million and contains the recurring unit represented by the formula 1 in a content of at least 5 mol % based on the total recurring units.

One example of synthesizing the first radiation absorbing polymer from a polymer containing dicarboxylic acid group or acid anhydride group is by the esterification reaction between a copolymer containing at least both the recurring unit represented by the following formula 3 or 3' and the recurring unit represented by the following formula 2 and an organic chromophore compound which can absorb the predetermined wavelength radiation represented by the following formula 4:

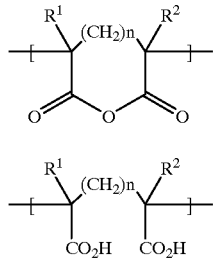

(3)

(3')

wherein

R$^1$ and R$^2$ are the same as defined with respect to the above formula 1:

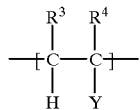

(2)

wherein

R$^3$, R$^4$ and Y are the same as defined with respect to the above formula 2:

Ar—X—OH (4)

wherein

X and Ar are the same as defined with respect to the above formula 1.

As the copolymer containing the recurring units of formulae 3 and 4, there are illustrated, for example, copolymers between maleic anhydride and alkyl vinyl ether or styrene, the copolymer between maleic anhydride and methyl vinyl ether represented by the following formula 9 being particularly preferred. The copolymer represented by formula 9 preferably has a number average molecular weight of from about 300 to about 10 millions, particularly from 10,000 to 3 millions.

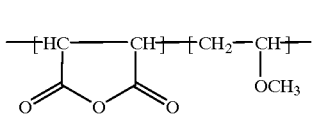

(9)

The recurring unit represented by the following formula 10 is formed by the reaction between the recurring unit of the above formula 9 containing an acid anhydride group and the compound represented by the above formula 4.

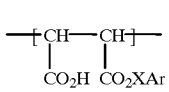

(10)

The organic chromophore compound of the present invention represented by the above formula 4 and containing a hydroxyl group isolated from conjugation system is a compound wherein the hydroxyl group is bonded to an organic chromophore which absorbs the predetermined wavelength radiation through at least one alkylene group. There is no particular limitation as to the chromophore itself, but those which strongly absorb radiation of the exposure wavelength region to be used for imagewise exposure of a photoresist and which show good solubility, good etch-ability and no influence on the resist are preferable. Preferable organic chromophore compounds are those compounds, which are represented by the following formula 5 or 6:

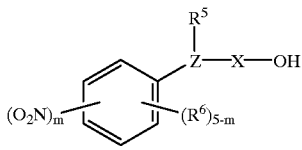

(5)

wherein

X represents a methylene group or a straight, branched or cyclic alkylene group containing at least 2 carbon atoms, Z represents an oxygen atom, a nitrogen atom or a sulfur atom, R$^5$ exists only when Z represents a nitrogen atom and, when it exists, R$^5$ represents a hydrogen atom, an alkyl group or other organic group, R$^6$ represents a hydrogen atom, an alkyl group, an alkoxy group, a halogen atom, a hydroxyl group, an amino group, a nitro group, a halogenated alkyl group, a substituted carbonyl group, a substituted or non-substituted oxycarbonyl group, a substituted or non-substituted phenyl group or other organic group, m represents 0 or an integer of 1 to 4 and, when a plurality of R$^6$ groups exist on the ring, they may be the same or different from each other or may be connected to each other to form an aliphatic or aromatic ring;

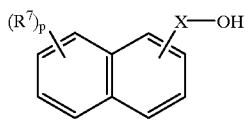 (6)

wherein

X represents a methylene group or a straight, branched or cyclic alkylene group containing at least 2 carbon atoms, p represents 0 or an integer of 1 to 7, $R^7$ represents a hydrogen atom, an alkyl group, an alkoxy group, a halogen atom, a hydroxyl group, an amino group, a nitro group, a substituted carbonyl group, a substituted or non-substituted oxycarbonyl group, a substituted or non-substituted phenyl group or other organic group and, when a plurality of $R^7$ groups exist on the ring, they may be the same or different from each other or may be connected to each other to form an aliphatic or aromatic ring.

Of the compounds represented by the above formula 5, preferable ones are those compounds represented by the following formula 11:

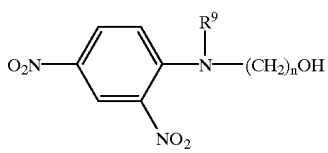 (11)

wherein $R^9$ represents a hydrogen atom or an alkyl group, and n represents an integer of 1 or more.

Of the compounds represented by formula 11, those compounds wherein $R^9$ represents a hydrogen atom, a methyl group or an ethyl group and n represents 2 or 3 are preferred. Specific compounds represented by formula 11 or 5 are exemplified by the following formulae (I) to (VII):

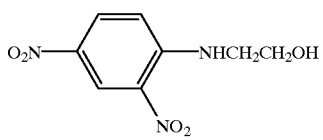 (I)

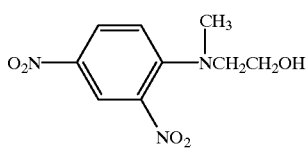 (II)

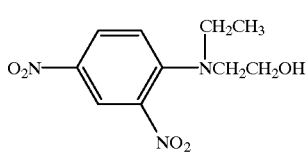 (III)

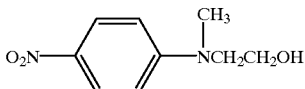 (IV)

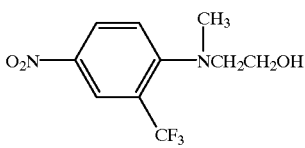 (V)

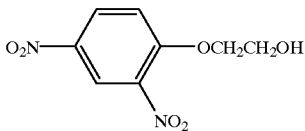 (VI)

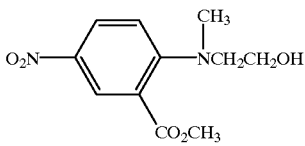 (VII)

Preferable examples of the compound represented by formula 6 are those compounds represented by the following formulae (VIII) and (IX);

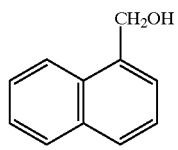 (VIII)

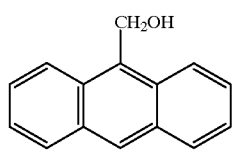 (IX)

In relation to absorption wavelength, compounds represented by formula 5 are preferred for i-line (wavelength: 365 nm), and compounds represented by formula 6 for KrF eximer laser (248 nm).

In addition, for the purpose of improving properties of the first radiation absorbing polymer, carboxylic acid group and/or acid anhydride group remaining in main chain of the first radiation absorbing polymer are amidized and/or imidized with a compound of the following formula 7 having a reactive amino group to obtain a second radiation absorbing polymer having amide groups and/or imide groups in addition to ester groups.

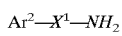 (7)

wherein $Ar^2$ represents a substituted or non-substituted benzene ring, hetero ring or condensed ring bonded to $X^1$ directly or through an oxygen atom, a nitrogen atom or a sulfur atom if necessary, and $X^1$ represents a direct linkage, a methylene group or a straight, branched or cyclic alkylene group containing at least 2 carbon atoms.

Examples of the amide group and imide group further introduced are shown by formulae 12 and 13.

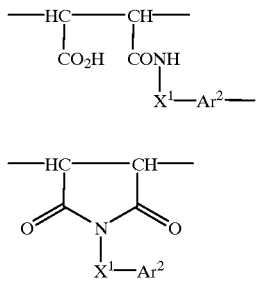
(12)

(13)

Specific examples of the compounds represented by formula 7 are those represented by the following formula 14:

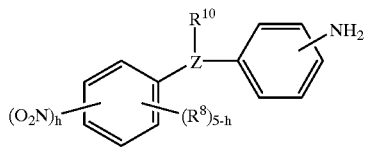
(14)

wherein

Z represents an oxygen atom, a nitrogen atom or a sulfur atom, $R^{10}$, which exists when Z represents a nitrogen atom, in this case represents a hydrogen atom, an alkyl group or other organic group, h represents an integer of 1 to 4, $R^8$ represents a hydrogen atom, a halogen atom, a hydroxyl group, an amino group, a nitro group, a sulfonic acid group or an organic group and, when a plurality of $R^8$ exist on the ring, $R^8$'s may be the same or different from each other or may be connected to each other to form an aliphatic ring or an aromatic ring.

Of the compounds represented by formula 14, those compounds wherein Z represents a nitrogen atom and $R^{10}$ represents a hydrogen atom and which are represented by the following formula 8 are preferred:

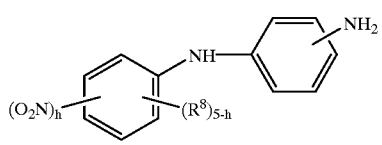
(8)

wherein $R^8$ and h are the same as defined for formula 14.

Of the compounds represented by the above formula 7, those represented by the following formulae (X) to (XVII) are particularly preferred:

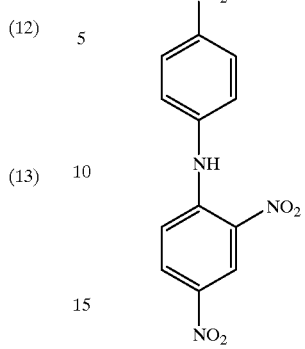
(X)

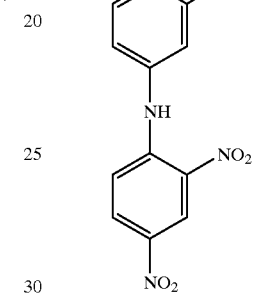
(XI)

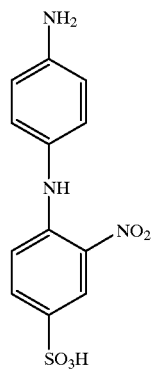
(XII)

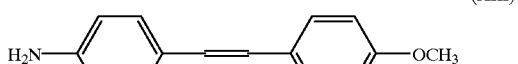
(XIII)

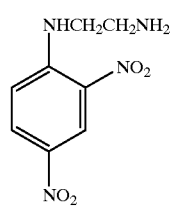
(XIV)

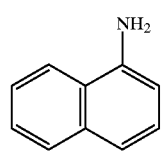
(XV)

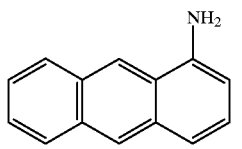

(XVI)

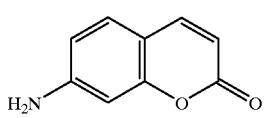

(XVII)

Of these, aminoanthracene is preferred as materials for KrF eximer laser antireflective coatings due to their strong absorption for a KrF eximer laser (248 nm). In the present invention, however, the compounds having an reactive amino group may not necessarily have absorption in the predetermined region, since those which can improve polymer properties such as film forming property besides improving radiation absorbing property of a resulting polymer may also be used.

On the other hand, the film forming composition of the present invention contains the above-described radiation absorbing polymer and is usually prepared by dissolving the radiation absorbing polymer in a proper solvent mainly to utilize as a bottom reflection-preventing coating upon manufacture of integrated circuits. In the case of using the radiation absorbing polymer of the present invention for manufacturing the integrated circuits, those which have a strong absorption in the wavelength region of from 180 to 450 nm are preferred for exposure source of UV or deep UV. Therefore, compounds represented by the above formula 4 and, if necessary, compounds represented by formula 7 are selected so that the resulting radiation absorbing polymer can absorb radiation of 180 to 450 nm in wavelength. Use of such polymer capable of strongly absorbing radiation of such wavelengths enables absorption of radiation used for exposure by the antireflective coating, thereby reflection of exposure radiation from the substrate being prevented and defect-free resist pattern being formed.

As preferred examples of solvents for obtaining the film forming composition, there are illustrated methyl ethyl ketone (MEK), γ-butyrolactone, dimethylacetamide, dimethylformamide, dimethyl sulfoxide, N-methylpyrrolidone, ethyl lactate (EL), methoxypropanol (PGME), propylene glycol monomethyl ether acetate (PGMEA), cyclohexanone and mixtures thereof. However, solvents to be used in this invention are not limited only to them. Of these solvents, γ-butyrolactone, EL, PGME, PGMEA, and a mixture of PGME and PGMEA are particularly preferred. Concentration of the radiation absorbing polymer in the composition is 20% by weight or less.

In the case of preparing the film forming composition using the radiation absorbing polymer of the present invention, conventionally known low molecular compounds such as radiation absorbing compounds, adhesion promoters, etc. or polymer materials may optionally be added to the composition. As the examples of the low molecular compounds, surfactants or silane series leveling agents may be used in small amounts for adjusting adhesion to a substrate and coating properties. In the case of adding a compound of formula 7 having a reactive amino group, solubility of the baked coating for a resist solvent is further reduced. In the case of adding the compound having a reactive amino group, it is added in an amount of preferably 0.1 to 1.0 part by weight based on 1 part by weight of the radiation absorbing polymer. Particularly preferably, where acid anhydride groups and/or dicarboxylic acid groups partly remain, molar ratio of the reactive amino group to sum of the remaining acid anhydride groups and/or dicarboxylic acid groups is about 1:1. The reason why solubility of the coating decreases by the addition of the compound having a reactive amino group is not clear. However, it may be attributed to the reaction of the carboxylic acid groups or acid anhydride groups remaining in the polymer with the compound having a reactive amino group, which, however, is not to be construed as limiting the present invention.

In forming the antireflective coating, the thus prepared film forming composition is applied to a substrate in a dry film thickness of 500 to 50,000 Å by spin coating, cast coating, roller coating or the like, then baked to make it insoluble in a photoresist solvent. The baking is conducted at a temperature of, for example, about 90 to about 250° C., preferably 180 to 200° C.

A photoresist is applied to the antireflective coating thus formed on the substrate in a predetermined thickness, then prebaked to form a photoresist layer. Solvents to be used for the photoresist include EL, PGMEA and ketones, though not being limited only to them. As the photoresist, either positive working or negative working photoresists may be used. Prebaking temperature varies depending upon the kind of photoresist to be used, but is usually about 30 to about 200° C. Kind of radiation for exposure of the photoresist can be selected from among visible lights, UV rays, deep UV rays, X-rays, electron beams, etc., but as the radiation absorbing polymer to be used for forming the antireflective coating, those polymers which absorb the radiation of wavelengths required for exposure, as has been described hereinbefore are selected. After the patterned exposure, the photoresist is subjected to development optionally after post-exposure baking, thus a resist pattern being formed. Then, the antireflective coating is dry etched using gas plasma such as oxygen plasma thereby to form a resist pattern that serves to process or treat the substrate. Additionally, as the developer solution, there may be used known ones such as an alkaline aqueous solution or an alkali aqueous solution which contains a metal hydroxide, an organic amine or the like dissolved therein.

The radiation absorbing polymer of the present invention shows a good absorption for radiation of predetermined wavelengths, can form an antireflective coating having a good adhesion to substrate, and is soluble in a solvent for a photoresist. Therefore, in practicing such photo-lithographic process, it enables one to use the same coating apparatus, the same waste liquor apparatus and the same rinsing solution as those for the resist, thus unnecessary equipment and unnecessary processes being eliminated. Hence, the polymer is greatly advantageous for users.

While the radiation absorbing polymer of this invention is soluble in a solvent for resist, it becomes insoluble in the solvent for resist as well as aqueous alkali developers for resist upon being heated at a proper temperature after being formed into a coating on the substrate as described above. Therefore, it is not easily removed during wet development of the resist. In addition, this coating can be formed easily and can be removed with ease by dry etching using the resist pattern as an etching mask. Thus, the polymer has the advantage that it can be used with ease, and the thus formed antireflective coating shows good properties.

The antireflective coating formed has a uniform thickness coating even on a substrate with different surface in level, that is, it shows a good coverage property. And it can be uniformly removed by etching.

The compounds of the present invention represented by the above formula 5 may be easily prepared, for example, by reaction of the compound of formula 15. and the compound of formula 16:

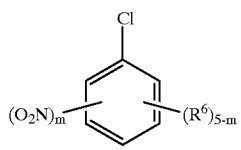
(15)

wherein $R^6$ and m are the same as defined for the above formula 5;

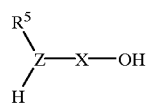
(16)

wherein X, Z and $R^5$ are the same as defined for the above formula 5.

BEST MODE FOR CARRYING OUT THE INVENTION

Figure 1:
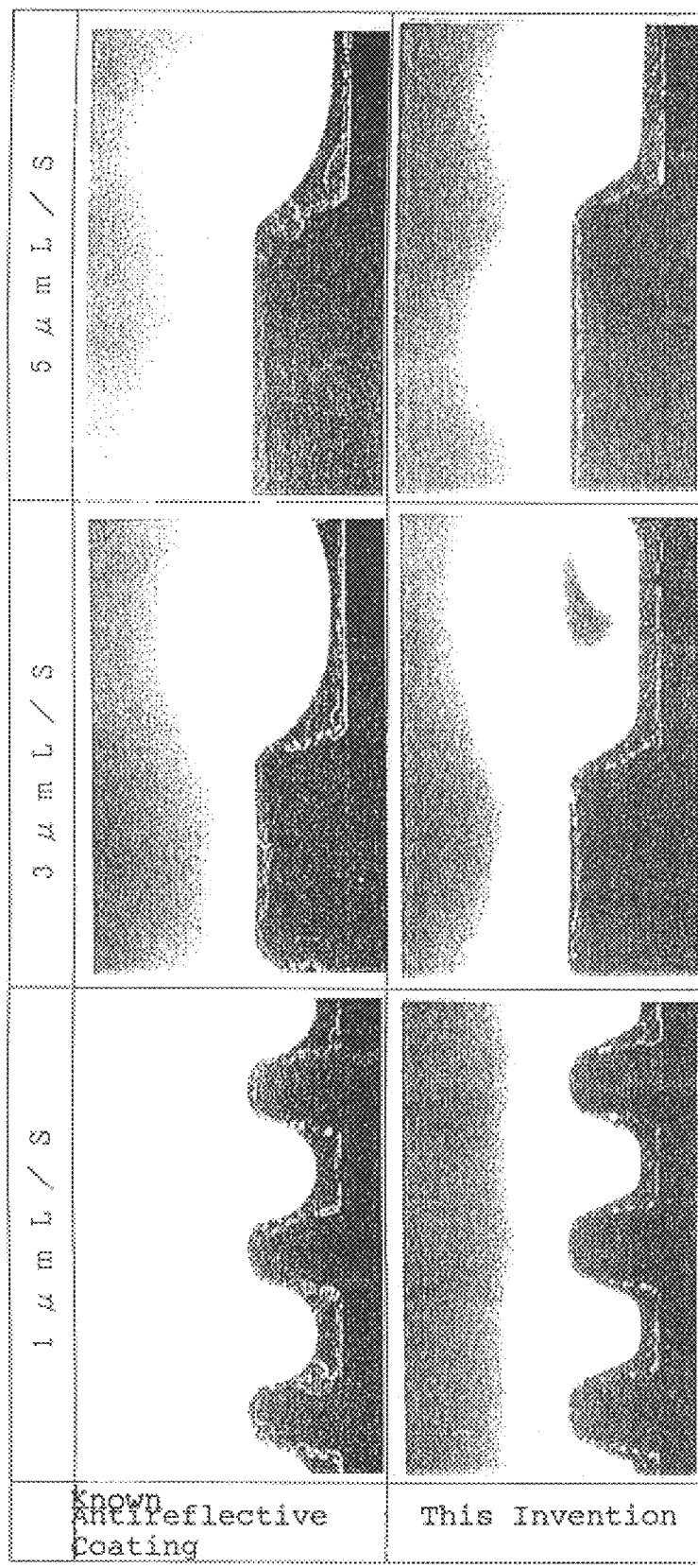
FIG. 1 is a graph comparing coverage property of the antireflective coating formed from the solution of the film forming composition of the present invention with that of an antireflective coating formed from a known antireflective film forming solution.

The present invention is now described more in details by reference to the following Examples which, however, are not construed to be limitative at all.

SYNTHESIS EXAMPLE 1
Synthesis of N-(2,4-dinitrophenyl)-N-methyl-aminoethanol 20.3 g of N-methylaminoethanol was dissolved in 100 ml of ethanol and, while stirring, solid 1-chloro-2,4-dinitrobenzene was added to the solution by portions at room temperature. After completion of the addition, 8.4 g of sodium hydrogencarbonate was gradually added to the reaction mixture, followed by stirring for 10–15 minutes at room temperature. Then, the reaction mixture was heated at 60° C. After completion of the reaction, the reaction solution was cooled to room temperature, and poured into 300 ml of water. Continued stirring of the solution yielded a yellowish oily product. Stirring was then discontinued and, after completion of oil formation, the supernatant was removed. After adding water thereto, the solution obtained was stirred and the oil layer formed was collected by separation, and dried to obtain a yellowish oily product. Chemical structure of the product was confirmed by $^1$H-NMR. Absorptivity coefficient of the product at 365 nm was measured to be $1.79 \times 10^4$ by UV measurement in ethanol. $^1$H-NMR(CDCl$_3$), TMS standard (400 MHz): 2.22(s,1H), 3.03(s,3H), 3.62(m, 2H), 3.92(m,2H), 7.24(d,1H), 8.18(d,1H), 8.63(s,1H).

EXAMPLE 1
Polymer synthesis 1 (polymer for i-line antireflective polymer)

26.5 g of N-(2,4-dinitrophenyl)-N-methylaminoethanol was dissolved in 300 g of cyclohexanone, and while stirring, 27.4 g of powdery poly(maleic anhydride-co-methyl vinyl ether) (molecular weight: 1,980,000; copolymerization ratio: 1:1) commercially available from Aldrich Company was gradually added thereto. After completion of the addition, the reaction mixture was heated up to 140° C. and, after 6-hour reaction, the reaction solution was cooled to room temperature, the reaction solution was reprecipitated from isopropanol in a conventional manner, followed by drying in vacuum. The polymer had a solid absorptivity of 16 at 365 nm by UV measurement in dimethylformamide (DMF). The solid absorptivity was calculated by the formula of A/(C×d), wherein C represents concentration (mg/g) of the solution for UV measurement, d represents specific gravity of the solvent, and A represents absorptivity at 365 nm. $^1$H-NMR (DMSO-d$_6$) δ (integration ratio) 12.56 (1, carboxylic acid in the polymer), 8.55 (0.88, proton on the benzene ring of the dye bonded to the polymer), 8.2 (0.9, proton on the benzene ring of the dye bonded to the polymer), 7.38 (b, 0.89, benzene ring of the dye bonded to the polymer), 1.0–4.0 (b, aliphatic proton in the polymer). $^1$H-NMR spectrum revealed that no non-reacted dye remained in the polymer, and that the dye was bonded to the polymer. GPC (gel permeation chromatography) analysis using lithium chloride-added dimethylformamide as flowing phase and polyethylene oxide as a standard substance revealed that weight average molecular weight of the polymer, Mw, was 75,000, number average molecular weight, Mn, was 32,000, and the polydispersity, Mw/Mn, was 2.34.

EXAMPLE 2
Polymer synthesis 2 (polymer for i-line antireflective polymer)

26.5 g of N-(2,4-dinitrophenyl)-N-methylaminoethanol was dissolved in 300 g of cyclohexanone, while stirring and 27.4 g of powdery poly-(maleic anhydride-co-methyl vinyl ether) commercially available from Aldrich Company (the same as used in Example 1) was gradually added thereto. After completion of the addition, the reaction mixture was heated up to 140° C. and, after 4-hour reaction, the reaction solution was cooled to 90° C. or less. Subsequently, 8.2 g of N-(2,4-dinitrophenyl)phenylenediamine (Disperse Yellow 9, DSY-9) was added thereto, and the reaction solution was heated at 140° C. for about one hour. Thereafter, the reaction solution was cooled to room temperature, and the reaction solution was reprecipitated from isopropanol in a conventional manner to obtain a solid polymer. The polymer had a solid absorptivity of 26 at 365 nm by UV measurement in DMF. $^1$H-NMR (DMSO-d$_6$): δ (integration ratio) 12.41 (1, carboxylic acid in the polymer), 10.13 (b, 0.54, NH proton of DSY-9 bonded to the polymer), 8.86 (b, 0.51, one proton on the benzene ring of DSY-9 bonded to the polymer), 8.55 (0.54, one proton on the benzene ring of the dye of Synthesis Example 1 bonded to the polymer), 8.19 (b, 1.07), 6.8–7.8 (b, 3.39), 1.0–4.0 (b, aliphatic proton in the polymer). $^1$H-NMR spectrum revealed that no non-reacted dye remained in the polymer, and that the two dyes were bonded to the polymer in almost the same proportion. GPC analysis using lithium chloride-added dimethylformamide as flowing phase and polyethylene oxide as a standard substance revealed that weight average molecular weight of the polymer, Mw, was 69,000, number average molecular weight, Mn, was 28,000, and the polydispersity, Mw/Mn, was 2.46.

EXAMPLE 3
Preparation of a polymer solution 6 g of each of the polymers obtained in Examples 1 and 2 was dissolved in 100 g of a mixture of PGMEA/PGME (mixing ratio: 1:1 by weight) under heating at 50° C. and, after the polymer was completely dissolved, the solutions were cooled to room temperature, and filtered through a 0.1-micron filter to obtain film forming solutions A and B. Separately, 2 g of Disperse Yellow 9 (DSY-9) was added to each of the film forming solutions A and B, and the thus-obtained solutions were filtered through a 0.1-micron filter to obtain film forming solutions C and D.

COMPARATIVE EXAMPLE 1

An AZ-BARLi solution for forming antireflective coating commercially available from Hoechst Co. (polymers contained in this solution being scarcely soluble in solvents usually used for resists) was spin-coated on a quartz substrate and a silicon wafer under proper conditions, and the thus-obtained films were used as comparative samples.

EXAMPLE 4

The film forming solutions A, B, C and D obtained in Example 3 were respectively spin-coated on quartz substrates and silicon wafers at a rotation of 3,000 rpm, and the resulting polymer films were used for the subsequent experiments.

EXAMPLE 5

Experiments for comparing rinsing property

The films on 4-inch silicon wafers obtained in Comparative Example 1 and Example 4 were subjected to a rinsing test by dropping a rinsing solution (PGMEA: PGME=3:7) thereon while rotating at a rotation of 800 rpm on a spin coater for 10 seconds, 20 seconds or 30 seconds to examine rinsed state. As a result, it was found that, while the film of the present invention of Example 4 was completely removed by 10-second rinsing, the comparative AZ-BARLi film of Comparative Example 1 was removed only partly even by 30-second rinsing.

EXAMPLE 6

Experiments for comparing coverage

The film forming solutions A, B, C, D, AZ-BARLi and, further, other known antireflection film forming solution were respectively coated in the same manner as in Comparative Example 1 and Example 4 on silicon wafers having a previously formed pattern of 1.0 $\mu$m in height and 1 $\mu$m, 3 $\mu$m and 5 $\mu$m in pattern gaps, followed by baking on a hot plate at 100° C. to form 1500 Å antireflective coatings. Observation under a scanning electron microscope (SEM) of the coatings revealed that, as is shown in FIG. 1, the coatings in accordance with the present invention showed better coverage property than that formed from other known antireflective coating solution (known antireflective coating). Also, the coatings of the present invention showed about the same excellent coverage property as that of AZ-BARLi.

EXAMPLE 7

Comparison as to absorption for i-line

The polymer films on the quartz plates obtained in Comparative Example 1 and Example 4 were baked at 200° C. for 90 seconds, and absorptivity at 365 nm of each film was measured using a spectrometer. As a result, it was found that the antireflective coatings obtained from the film forming solutions A, B, C and D of the present invention had an absorptivity per unit thickness of 70 to 105, taking that of the coating formed from AZ-BARLi as 100.

EXAMPLE 8

Experiments for testing dissolution resistance of baked antireflective coating against resist solvent and developer Resist solvents (MEK, EL, PGMEA and PGME) and a developer solution (2.4 wt % aqueous solution of tetramethylammonium hydroxide) were respectively dropped onto films formed by coating the film forming solutions A, B, C and D on silicon wafers and baked at 100° C., 150° C., 180° C. or 200° C. and, after a predetermined period of time, the solutions on the films were wiped off to check the reduction in thickness of the films. As a result, it was confirmed that reduction in thickness was prevented by baking the antireflective films or coatings of the present invention at proper temperatures (180° C. or above). Thus, it was confirmed that the antireflective coatings of the present invention which are soluble in resist solvents show, after being baked at suitable temperatures, no change of the antireflective coatings themselves upon formation of a resist film or upon development.

EXAMPLE 9

Evaluation of antireflective coating through resist pattern

The film forming composition solution D of the present invention was coated on a silicon wafer in a dry thickness of 1,500 Å and, after baking at 200° C. for 90 seconds, a highly sensitive i-line resist AZ-7800 made by Hoechst Co. was coated thereon in a baked thickness of 1.07 $\mu$m, followed by patterned exposure and development to form a resist pattern on the antireflective coating. Similarly, a resist pattern was formed under the same conditions on a silicon wafer not having thereon the antireflective coating using AZ-7800. Additionally, processing conditions for the resists were: prebaking: 90° C. for 60 seconds; exposure: about 300 mJ/cm$^2$ using an i-line stepper LD-5015iCW (NA=0.5, $\sigma$=0.5). Baking after the exposure was conducted at 110° C. for 60 seconds, and development was conducted according to the paddle method in 2.38 wt % solution of tetramethylammonium hydroxide (TMAH) for 60 seconds. Observation of the thus-obtained resist patterns under SEM revealed that the antireflective coating of the present invention provided a resist pattern with higher resolution than that not using the antireflective coating. Also, the antireflective coating of the present invention showed about the same pattern profile as that obtained by using AZ-BARLi as an antireflective coating.

EXAMPLE 10

Experiments for comparing etchability

Antireflective films were obtained in the same thickness using the polymer composition of the present invention and AZ-BARLi, respectively, baked at 200° C., then subjected to etchability-comparing test using a dry etching apparatus. As a result, it was found that the polymer film of the present invention showed the same, or more, etching rate as AZ-BARLi.

EXAMPLE 11

Polymer synthesis 3 (polymer for antireflective coating for KrF eximer laser(wavelength: 248nm))

125 g of 9-hydroxymethylanthracene and 156 g of powdery poly-(maleic anhydride-co-methyl vinyl ether) (number average molecular weight: about 67,000; copolymerization ratio: 1:1) commercially available from Aldrich Company were added to 1400 g of cyclohexanone and stirred at room temperature. Thereafter, the reaction mixture was heated up to 145° C. and, after 6-hour reaction at this temperature, the reaction solution was cooled to 100° C. or less, and 164 g of N-2,4-dinitro-phenyl)phenylenediamine was added thereto, followed by heating the reaction mixture solution at 145° C. for further 3 hours. Then, the reaction solution was cooled to room temperature, and a solid polymer was reprecipitated from isopropanol in a conventional manner. The precipitated solid polymer was filtered out, washed with isopropanol, then dried in vacuum. GPC analysis using lithium chloride-added dimethylformamide as flowing phase and polyethylene oxide as a standard substance revealed that weight average molecular weight of the polymer, Mw, was 150,000, number average molecular weight, Mn, was 50,000, and the polydispersity, Mw/Mn, was 3. Also, the thus-obtained polymer was dissolved in cyclohexanone, and the solution was filtered through a 0.1-micron, Teflon-coated filter, coated on a silicon wafer, and baked at 220° C. for 60 seconds. Spectral ellipsometry of the thus-obtained film revealed that the film had a refractive index of 1.59 at 248 nm and a k value (imaginary number portion of the refractive index of the film) of 0.42.

EXAMPLE 12

Polymer synthesis 4 (polymer for antireflective coating for KrF eximer laser(wavelength: 248 nm))

A polymer having a strong absorption for KrF wavelengths was obtained in the same synthesizing manner as in Example 11 using 174 g of poly(maleic acid-co-methyl vinyl ether) (number average molecular weight: about 20,000; copolymerization ratio: 1:1) in place of poly(maleic anhydride-co-methyl vinyl ether) used in Example 11. GPC analysis using lithium chloride-added dimethylformamide as flowing phase and polyethylene oxide as a standard substance revealed that weight average molecular weight of the polymer, Mw, was 75,000, number average molecular weight, Mn, was 24,200, and the polydispersity, Mw/Mn, was 3.1. Also, the thus-obtained polymer was dissolved in cyclohexanone, and the solution was filtered through a 0.1-micron, Teflon-coated filter, coated on a silicon wafer, and baked at 220° C. for 60 seconds. Spectral ellipsometry of the thus-obtained film revealed that the film had a refractive index of 1.59 at 248 nm and a k value of 0.40.

EXAMPLE 13

The polymers obtained in Examples 11 and 13 were subjected to the tests on coverage property, resistance against resist solutions and a developer after being baked, and etchability in the same manner as in Examples 6, 8 and 10. As a result, there were obtained the same results as with the polymers for i-line antireflective coating.

EXAMPLE 14

Evaluation of antireflective coating through resist pattern

A solution of the polymer obtained in Example 11 or 12 was spin-coated on a silicon wafer in a baked thickness of 60 nm baked at 220° C. for 60 seconds, then KrF resist DX1100P made by Hoechst Co. was coated on the antireflective coating in a thickness of 0.75 micron and was subjected to patterned exposure and development. The thus-obtained resist pattern was observed under an electron microscope. Additionally, processing conditions for the resists were: prebaking: 110° C. for 60 seconds; exposure: about 48 mJ/cm² using a KrF stepper NSR2005 EX10B made by Nikon Co., Ltd. (NA=0.55, σ=0.55). Baking after the exposure was conducted at 70° C. for 90 seconds, and development was conducted in a 2.38 wt % solution of TMAH of 23° C. for 60 seconds. Observation of the thus-obtained resist patterns under electron microscope revealed that standing wave of the resist profile due to reflection of exposure radiation from the substrate did not appear, and that a vertical resist profile was obtained. Thus, the polymer material of the present invention can also provide a material adapted for KrF wavelength exposure by selecting a proper radiation absorbing dye.

INDUSTRIAL APPLICABILITY

The radiation absorbing polymers in accordance with the present invention and the film forming compositions containing them may be utilized as materials for forming an antireflective coating on the substrate upon formation of fine resist images utilizing photolithography as in the field of manufacturing integrated circuit elements.

What is claimed is:

1. A radiation absorbing polymer which absorbs radiation with wavelength in the range of 180 nm to 450 nm, comprising at least a recurring unit as represented by formula 1 and a recurring unit as represented by formula 2;

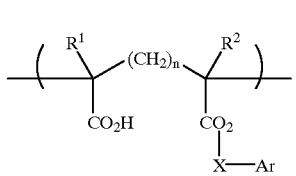

(1)

wherein $R^1$ and $R^2$ represent independently a hydrogen atom, or an alkyl group;

X is absent, or represents a methylene group, a linear alkyl group of at least 2 carbon atoms, or branched or cyclic alkylene group with at least 3 carbon atoms, Ar is an organic chromophore that absorbs radiation with wavelength in the range of 180 nm to 450 nm and represents a substituted or non-substituted benzene ring, a heterocyclic ring or a condensed ring which is bonded to X directly or through an oxygen atom or a sulfur atom;

and n is 0 or an integer of 1,

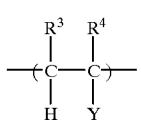

(2)

wherein $R^3$ and $R^4$ represent independently a hydrogen atom, an alkyl group, or a carboxyl group; and Y represents a hydrogen atom, a substituted or non-substituted alkoxyl group, a substituted or non-substituted alkyl group, a substituted carbonyl group, a substituted or non-substituted oxycarbonyl group or a substituted or non-substituted phenyl group; wherein said polymer is obtained by reacting the copolymer comprising at least a recurring unit as represented in formula 3 or 3' and a recurring unit as represented by formula 2, with a compound as represented by formula 4 which absorbs a radiation with wavelength in the range of 180 nm 450 nm;

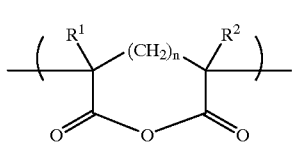

(3)

(3')

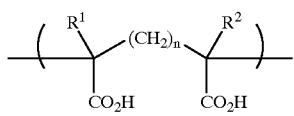

wherein
R¹ and R² are as defined above;

(2)

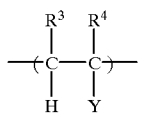

wherein
R³ and R⁴ and Y are defined above;

Ar—X—OH  (4)

wherein
X and Ar are as defined above.

2. A radiation absorbing polymer according to claim 1 wherein said the compound as represented by formula 4 is as defined in formula 5;

(5)

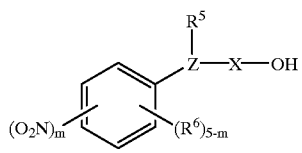

wherein
X is absent, or represents a methylene group, a linear alkyl group of at least 2 carbon atoms, or branched or cyclic alkylene group with at least 3 carbon atoms;

Z represents an oxygen atom, or a sulfur atom;
$R^5$ is hydrogen;
$R^6$ represents a hydrogen atom, an alkyl group, an alkoxyl group, a halogen atom, a hydroxyl group, an amino group, a nitro group, a halogenated alkyl group, a substituted carbonyl group, a substituted or non-substituted oxycarbonyl group, a substituted or non-substituted phenyl group or other organic group;
and m is 0 or an integer of 1 to 4; and
when plural $R^6$ exist on the ring, $R^6$ are the same or different and optionally form an aliphatic ring or an aromatic ring by connection with each other.

3. A radiation absorbing polymer according to claim 2 wherein said compound as represented by formula 4 is a compound as defined in formula 6:

(6)

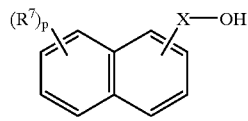

wherein
$R^7$ represents a hydrogen atom, an alkyl group, an alkoxyl group, a halogen atom, a hydroxyl group, an amino group, a nitro group, a substituted carbonyl group, a substituted or non-substituted oxycarbonyl group, a substituted or non-substituted phenyl group or other organic group;
when plural $R^7$ exist on the ring, $R^7$ are the same or different and optionally form an aliphatic ring or an aromatic ring by connection with each other.

4. The radiation absorbing polymer of claim 3 in which the copolymer is maleic anhydride methyl vinyl ether copolymer.

* * * * *